(12) United States Patent  (10) Patent No.: US 8,140,934 B2
Djordjevic et al.  (45) Date of Patent: Mar. 20, 2012

(54) LDPC-CODED MULTILEVEL MODULATION SCHEME

(75) Inventors: Ivan Djordjevic, Tuscon, AZ (US); Ting Wang, West Windsor, NJ (US); Lei Xu, Princeton, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 841 days.

(21) Appl. No.: 12/242,205

(22) Filed: Sep. 30, 2008

(65) Prior Publication Data

US 2009/0235143 A1 Sep. 17, 2009

Related U.S. Application Data

(60) Provisional application No. 61/036,112, filed on Mar. 13, 2008.

(51) Int. Cl.
*H03M 13/00* (2006.01)

(52) U.S. Cl. ........................................ 714/755; 714/780
(58) Field of Classification Search ................... 385/11; 359/337.5, 484; 398/209, 152; 714/752, 714/755, 756, 780
See application file for complete search history.

(56) References Cited

U.S. PATENT DOCUMENTS

| | | | |
|---|---|---|---|
| 6,603,890 B2 * | 8/2003 | Khosravani et al. | 385/11 |
| 6,865,305 B2 * | 3/2005 | Rasmussen et al. | 385/11 |
| 7,224,911 B2 * | 5/2007 | Dai et al. | 398/209 |
| 2006/0268392 A1 * | 11/2006 | Setti et al. | 359/337.5 |
| 2008/0279564 A1 * | 11/2008 | Han et al. | 398/152 |
| 2009/0080072 A1 * | 3/2009 | Barbarossa | 359/484 |

* cited by examiner

*Primary Examiner* — David Ton
(74) *Attorney, Agent, or Firm* — Jeffrey Brosemer; Joseph Kolodka

(57) ABSTRACT

A PMD compensation scheme suitable for use in multilevel block-coded modulation schemes with coherent detection.

1 Claim, 4 Drawing Sheets

LDPC-CODED MULTILEVEL MODULATION SCHEME

CROSS REFERENCE TO RELATED APPLICATIONS

This application claims the benefit under 35 U.S.C. §119 (e) of U.S. Provisional Application No. 61/036,112, filed Mar. 13, 2008, the entire contents and file wrapper of which are hereby incorporated by reference for all purposes into this application.

FIELD OF THE INVENTION

This invention relates generally to the field of telecommunications. More particularly, it pertains to a method for compensating Polarization Mode Dispersion effects in multilevel block coded modulation schemes with coherent detection.

BACKGROUND INFORMATION

As telecommunications demand increases, network operators have begun planning for 100 Gb/s dense wavelength division multiplexed (DWDM) optical systems. Unfortunately, the performance of optical systems operating at these data rates may be degraded by intrachannel and interchannel fiber nonlinearities, polarization mode dispersion (PMD) and chromatic dispersion.

In order to address these and other infirmities associated with high performance optical systems, advanced techniques and devices for the modulation, detection, coding and signal processing are being pursued.

SUMMARY OF THE INVENTION

In an exemplary embodiment, the present invention is directed to a PMD compensation scheme for use in multilevel (M>=2) block-coded modulation schemes with coherent detection, using Alamouti-type polarization-time coding in concatenation with LDPC codes as channel codes.

The aforementioned and other features and aspects of the present invention are described in greater detail below.

DETAILED DESCRIPTION

Figure 1A:
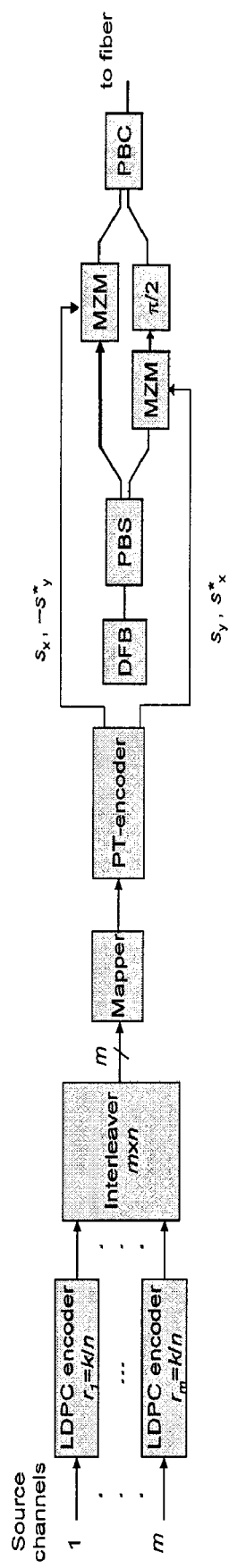
FIG. 1 illustrates the architecture of polarization-time coding scheme concatenated with LDPC coding for multilevel modulations where 1(a) shows the transmitter architecture, 1(b) shows a receiver architecture, and 1(c) shows a coherent detector configuration.

The following merely illustrates the principles of the invention. It will thus be appreciated that those skilled in the art will be able to devise various arrangements which, although not explicitly described or shown herein, embody the principles of the invention and are included within its spirit and scope.

Furthermore, all examples and conditional language recited herein are principally intended expressly to be only for pedagogical purposes to aid the reader in understanding the principles of the invention and the concepts contributed by the inventor(s) to furthering the art, and are to be construed as being without limitation to such specifically recited examples and conditions.

Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the diagrams herein represent conceptual views of illustrative structures embodying the principles of the invention.

By way of some additional background, a number of methods have been developed which deal with PMD in the electrical domain. In particular, (i) turbo equalization (See, e.g., I. B. Djordjevic, H. G. Batshon, M. Cvijetic, L. Xu, and T. Wang, "PMD compensation by LDPC-coded turbo equalization," *IEEE Photon. Technol. Lett.*, vol. 19, no. 15, pp. 1163-1165, Aug. 1, 2007; L. L. Minkov, I. B. Djordjevic, H. G. Batshon, L. Xu, T. Wang, M. Cvijetic, and F. Kueppers, "Demonstration of PMD compensation by LDPC-coded turbo equalization and channel capacity loss characterization due to PMD and quantization," *IEEE Photon. Technol. Lett.*, vol. 19, no. 22, pp. 1852-1854, Nov. 15, 2007; and M. Jäger, T. Rankl, J. Speidel, H. Bülow, and F. Buchali, "Performance of Turbo Equalizers for Optical PMD Channels," *J. Lightwave Technol.*, vol. 24, March 2006, 1226-1236.), and (ii) coded-OFDM (See, e.g., I. B. Djordjevic, "PMD compensation in fiber-optic communication systems with direct detection using LDPC-coded OFDM," *Opt. Express*, vol. 15, no. 7, pp. 3692-3701, Apr. 2, 2007. W. Shieh, X. Yi, Y. Ma, and Y. Tang, "Theoretical and experimental study on PMD-supported transmission using polarization diversity in coherent optical OFDM systems," *Opt. Express*, vol. 15, no. 16, pp. 9936-9947, Jul. 24, 2007.) have proven effective a countering the effects of PMD.

It has been shown in that differential group delay (DGD) up to 300 ps can be successfully eliminated for reasonable complexity of LDPC-coded turbo equalizer. For larger DGD values someone may use coded-OFDM instead. While the complexity of turbo equalizer grows exponentially as DGD increases, the coded-OFDM requires just the increase of a guard interval. However, the complexity of coded-OFDM might be prohibitively high especially when polarization-diversity schemes are used.

According to an aspect of the present invention, PMD compensation is based on Alamouti-type polarization-time (PT) coding, with LDPC codes as channel codes. The PT-encoder operates as follows. In the first half of ith time instance ("the first channel use") it sends QAM symbol $s_x$ to be transmitted using x-polarization channel and QAM symbol $s_y$ to be transmitted using y-polarization channel. In the second half of ith time instance ("the second channel use") it sends QAM symbol $-s^*_y$ to be transmitted using x-polarization channel, and QAM symbol $s^*_x$ to be transmitted using y-polarization channel. Therefore, the PT-coding procedure is similar to the Alamouti-scheme. We derived the optimum PT-decoder, and have found that its configuration is similar to the Alamouti combiner proposed in wireless communications.

The optimum estimates of transmitted symbols at the output of PT-decoder (for ASE noise dominated scenario) can be obtained as follows $$\tilde{s}_{x,i} = h^*_{xx} r_{x,1} + h_{xy} r^*_{x,2} + h^*_{yx} r_{y,1} + h_{yy} r^*_{y,2}, \tag{1}$$

$$\tilde{s}_{y,i} = h^*_{xy} r_{x,1} - h_{xx} r^*_{x,2} + h^*_{yy} r_{y,1} - h_{yx} r^*_{y,2}, \tag{2}$$

where $\tilde{s}_{x,i}$ and $\tilde{s}_{y,i}$ denote the PT-decoder estimates of symbols $s_{x,i}$ and $s_{y,i}$ transmitted in ith time instance. $h_{xx}$, $h_{xy}$, $h_{yx}$, and $h_{yy}$ are elements of Jones matrix $$H = \begin{bmatrix} h_{xx} & h_{xy} \\ h_{yx} & h_{yy} \end{bmatrix},$$

and can be determined by training based channel estimation. In case that only one polarization is to be used on a receiver side, say x-polarization, then the last two terms in equations (1) and (2) are to be omitted. However, the use of only one polarization—instead of both—on a receiver side results in 3 dB performance loss.

In contrast to the PMD turbo equalization scheme, whose complexity grows exponentially as the DGD increases, the complexity of the Alamouti-type PT encoder/decoder stays the same. Advantageously this scheme is able to achieve the efficiency in PMD compensation comparable or better than that of OFDM, with significantly lower complexity of both transmitter and receiver.

The scheme employs both polarizations on transmitter side. On the receiver side we have two options, namely: (i) to use only one polarization, or (ii) to use both polarizations. Both schemes are able to successfully eliminate the PMD. Unfortunately, the use of only one polarization, instead of both, on a receiver side results in 3 dB performance loss.

The polarization-time (PT) coding scheme, with an LDPC code as channel code, according to an aspect of the present invention is shown in FIG. 1a. As shown therein, a number of bit streams originating from m different information sources (source channels 1 . . . m) are encoded using different $(n,k_i)$ LDPC codes of code rate $r_i=k_i/n$ where $k_i$ denotes the number of information bits of ith ($i=1, 2, \ldots, m$) component LDPC code, and n denotes the codeword length, which is advantageously the same for all LDPC codes. According to an aspect of the present invention, the use of different LDPC codes allows optimal allocation of the code rates.

As those skilled in the art may appreciate, the bit-interleaved (BICM) scheme can be considered as a special multi-level coding (MLC) scheme in which all of the component codes are of the same rate. Continuing with our discussion of FIG. 1a, the outputs of the m LDPC encoders are written row-wise into a block-interleaver block which are then output to a mapper.

The mapper accepts m bits at time instance i from the (m×n) interleaver column-wise and determines the corresponding M-ary ($M=2^m$) signal constellation point ($\phi_{I,i}, \phi_{Q,i}$) in two-dimensional (2D) constellation diagram such as M-ary PSK or M-ary QAM. (The coordinates correspond to in-phase and quadrature components of M-ary 2D constellation.) The output of the mapper is provided to a PT-encoder.

The PT-encoder operates as follows. In the first half of ith time instance ("the first channel use") it sends symbol $s_x$ to be transmitted using x-polarization channel and symbol $s_y$ to be transmitted using y-polarization channel. In the second half of ith time instance ("the second channel use") it sends symbol $-s^*_y$ to be transmitted using x-polarization channel, and symbol $s^*_x$ to be transmitted using y-polarization. Those skilled in the art will recognize that the PT-coding procedure is somewhat similar to the Alamouti-scheme. Notice that with PT-coding data rate is reduced twice, on the other hand the PMD can successfully be compensated as shown later. The transmitter complexity is slightly higher than that required for a MLC/BICM scheme as it requires additional PT-encoder, a polarization beam splitter (PBS) and a polarization beam combiner (PBC). On the receiver side, we have the option to use only one polarization or to use both polarizations. The use of only one polarization results in 3 dB loss in receiver sensitivity because half of the transmitted power is not used on receiver side.

Figure 1B:
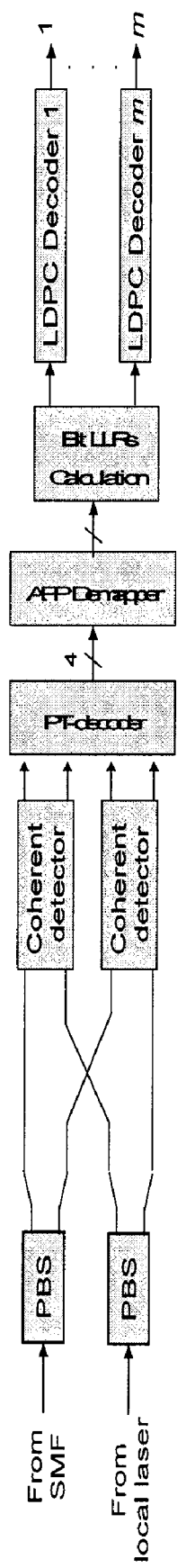
Figure 1C:
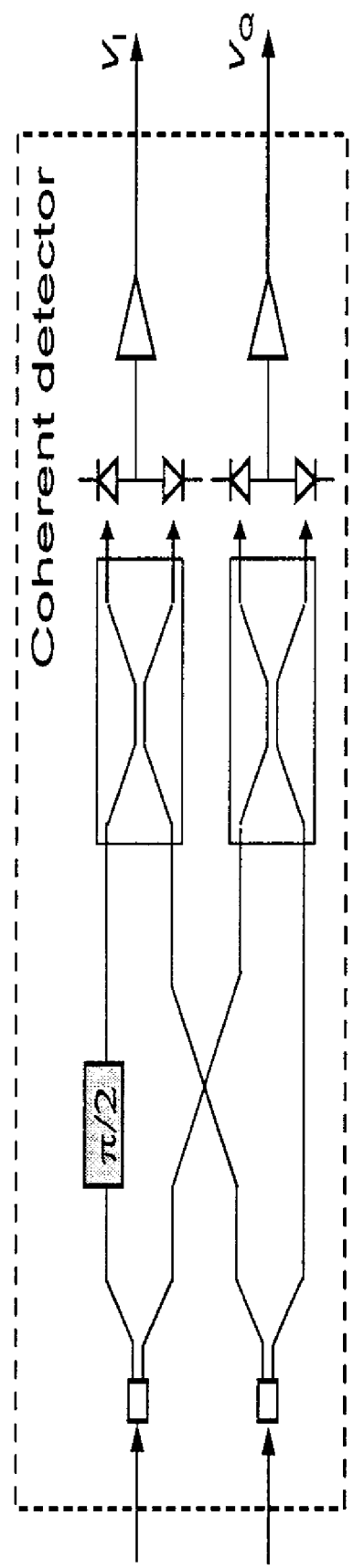

A receiver architecture employing both polarizations is shown schematically in FIG. 1(b). As shown in that figure it may be seen that the architecture uses an additional coherent detector (whose configuration is shown in FIG. 1(c)), a PT-decoder and two PBSs.

More particularly, and with continued reference to FIG. 1(b) there it is shown that optical signals from both single mode fiber and a local laser are provided to polarization beam splitters (PBM) from which the outputs are provided to a pair of coherent detectors. The outputs of the detectors are then provided to a Polarization Time decoder the outputs of which are input to a posterior probability (APP) demapper. Log likelihood ratios are calculated and the outputs are then provided to LDPC decoders 1 . . . m. Since a particularly distinguishing aspect of the present invention involves the Pt-decoder, we now describe that operation in more detail.

It may be understood that the optimum estimates of transmitted symbols at the output of the PT-decoder (for ASE noise dominated scenario) can be obtain as follows $$\tilde{s}_{x,i} = h^*_{xx} r_{x,1} + h_{xy} r^*_{x,2} + h^*_{yx} r_{y,1} + h_{yy} r^*_{y,2}, \quad (1)$$

$$\tilde{s}_{y,i} = h^*_{xy} r_{x,1} - h_{xx} r^*_{x,2} + h^*_{yy} r_{y,1} - h_{yx} r^*_{y,2}, \quad (2)$$

where $\tilde{s}_{x,i}$ and $\tilde{s}_{y,i}$ denote the PT-decoder estimates of symbols $s_{x,i}$ and $s_{y,i}$ transmitted in ith time instance; $h_{xx}$, $h_{xy}$, $h_{yx}$, and $h_{yy}$ are elements of Jones matrix $$H = \begin{bmatrix} h_{xx} & h_{xy} \\ h_{yx} & h_{yy} \end{bmatrix},$$

and can be determined by training based channel estimation. In case that only one polarization is to be used on a receiver side, say x-polarization, then the last two terms in equations (1) and (2) are to be omitted. However, the use of only one polarization, instead of both, on a receiver side results in 3 dB performance loss.

With continued reference to FIG. 1(b), it may be seen that the PT-decoder estimates are forwarded to the a posteriori probability (APP) demapper, which determines the symbol log-likelihood ratios (LLRs). The bit LLRs are calculated from symbol LLRs, and forwarded to the LDPC decoders.

The LDPC decoders employ the sum-product-with-correction term algorithm and provides the extrinsic LLRs to be used in the APP demapper. The extrinsic LLRs are iterated back and forward until the convergence or pre-determined number of iterations has been reached.

The LDPC codes used belong to the class of quasi-cyclic (array) codes of large girth ($g \geq 10$), so that corresponding decoder complexity is low, and do not exhibit the error floor phenomena in the region of interest in fiber-optics communications ($\leq 10^{-15}$). The LDPC codes are matched with APP demapper using EXIT chart analysis, so that iteration between APP demapper and LDPC decoders results is successful decoding. Notice that APP demapper and PT-decoder can be implemented as a single entity. We have found that in case when the CSI is known at the receiver side there is no performance degradation if APP demaper and PT-decoder are implemented separately, as shown in FIG. 1(b).

The Alamouti-type coding has already be considered for use in optical communications, but in different context, namely to deal with atmospheric turbulence present in free-space optical channel, and to deal with fiber nonlinearities.

With reference now to FIG. 1(c) there is shown a schematic of a coherent detector employed in the present invention. In particular, the two inputs to each one of the detectors are further split and one of the resulting split signals is phase shifted by a predetermined amount. The resulting four signals are then detected via a balanced set of photodetectors and then amplified as a pair of outputs $v_i$ and $v_Q$. As shown in FIG. 1(b), these outputs are then input into the PT-decoder.

Figure 2:
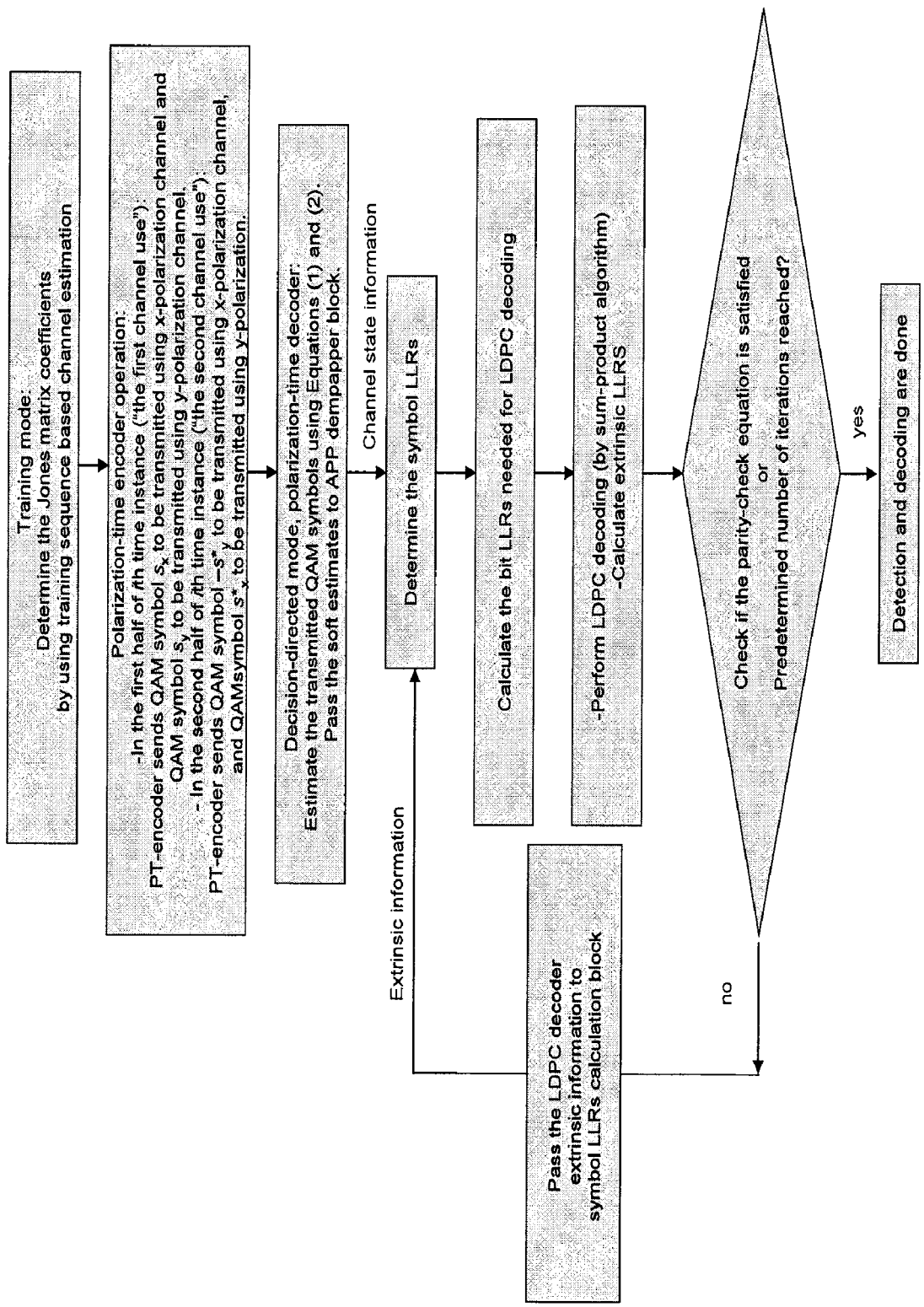
FIG. 2 illustrates a flow diagram of the present method.

FIG. 2 shows a flow chart depicting the overall method employed in the instant invention. More particularly, a training mode is employed in which the Jones matrix coefficients are determined using training sequence(s) based on channel estimation.

The PT encoder operation may be understood by the following operations: In the first half of an ith time instance (the first channel use). The PT-encoder then sends QAM symbol $s_x$ to be transmitted using x-polarization channel and QAM symbol $s_y$ to be transmitted using y-polarization channel. In the second half of ith time instance ("the second channel use") it sends symbol $-s^*_y$ to be transmitted using x-polarization channel, and symbol $s^*_x$ to be transmitted using y-polarization.

In the decision-directed mode of the PT-decoder, the transmitted QAM symbols are estimated using Equations (1) and (2) and soft estimates are passed to APP demapper block.

In the demapper, the symbol log likelihood rations (LLR) are determined. The bit LLRs needed for LDPC decoding are determined, and LDPC decoding (by sum-product) is performed and extrinsic LLRS are determined and used by the APP demapper. The extrinsic LLRs are iterated back and forward until the convenegence or pre-determined number of iterations has been reached.

Advantageously, the LDPC codes as used herein belong to a class of quasi-cyclic (array) codes of large girth (g>=10) so that corresponding decoder complexity is low and do not exhibit the eror flor phenomena in the region of interest in fiber-optic communication. The LDPC codes are matched with APP demapper using EXIT chart analysis so that iteration between APP demapper and LDPC decoders results in successful decoding.

Finally, it is understood that the above-described embodiments are illustrative of only a few of the possible specific embodiments which can represent applications of the invention. Numerous and varied other arrangements can be made by those skilled in the art without departing from the spirit and scope of the invention.

What is claimed is:

1. A polarization mode dispersion (PMD) compensation scheme for use in multilevel (M>=2) block-coded modulation system comprising the steps of:

encoding bit streams originating from m different information sources using different $(n, k_i)$ LDPC codes of code rate code rate $r_i=k_i/n$ where $k_i$ denotes the number of information bits of ith (i=1, 2, . . . , m) component LDPC code, and n denotes the codeword length, which is the same for all LDPC codes;

writing the m outputs produced by then LDPC encoder row-wise, into a block interleaver;

determining corresponding M-ary signal constellation points in two-dimensional constellation diagram;

encoding, through the effect of a Polarization-time encoder, the such that symbols to be transmitted using an x-transmission channel and symbols to be transmitted using a y-transmission channel are produced, and combining, the symbols into a single output stream for transmission.

* * * * *